(12) United States Patent
Ji et al.

(10) Patent No.: US 11,545,651 B2
(45) Date of Patent: Jan. 3, 2023

(54) OPTICAL FILM, DISPLAY SCREEN ASSEMBLY AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bing Ji, Beijing (CN); Xiaoxia Huang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 684 days.

(21) Appl. No.: 16/532,928

(22) Filed: Aug. 6, 2019

(65) Prior Publication Data
US 2020/0212369 A1 Jul. 2, 2020

(30) Foreign Application Priority Data

Jan. 2, 2019 (CN) .................. 201910002335.X

(51) Int. Cl.
*H01L 51/52* (2006.01)
*G02B 5/00* (2006.01)
(52) U.S. Cl.
CPC .......... *H01L 51/5284* (2013.01); *G02B 5/003* (2013.01); *H01L 51/5253* (2013.01)

(58) Field of Classification Search
CPC ............ H01L 51/5284; H01L 51/5253; H01L 51/5246; H01L 27/3244; H01L 51/5281; G02B 5/003; G02B 5/00; B32B 2457/208; G06F 3/0412
See application file for complete search history.

(56) References Cited

U.S. PATENT DOCUMENTS

| 8,345,187 | B2 | 1/2013 | Nakamoto et al. | |
|---|---|---|---|---|
| 10,698,246 | B2 | 6/2020 | Cheng et al. | |
| 2015/0331537 | A1* | 11/2015 | Wu | G02F 1/13338 345/173 |
| 2016/0132165 | A1* | 5/2016 | Yang | G06F 3/041 216/13 |
| 2017/0285394 | A1* | 10/2017 | Cheng | G02F 1/13306 |
| 2020/0045155 | A1* | 2/2020 | Ha | H04M 1/0283 |

(Continued)

FOREIGN PATENT DOCUMENTS

| CN | 101782700 A | 7/2010 |
|---|---|---|
| CN | 104865720 A | 8/2015 |
| JP | 2017083795 A | 8/2017 |

OTHER PUBLICATIONS

First Chinese Office Action from Chinese Patent Application No. 201910002335.X dated Sep. 16, 2020.

*Primary Examiner* — Kevin Quarterman
(74) *Attorney, Agent, or Firm* — Dilworth & Barrese, LLP.; Michael J. Musella, Esq.

(57) ABSTRACT

An optical film, a display screen assembly and a display device are disclosed. The optical film includes a light transmitting film and a light blocking film; the light transmitting film is a double-sided adhesive film, and the light blocking film is a flexible film and is connected with a periphery of the light transmitting film.

19 Claims, 4 Drawing Sheets

(56) References Cited

U.S. PATENT DOCUMENTS

| | | | |
|---|---|---|---|
| 2020/0119303 A1* | 4/2020 | Lo | H01L 51/56 |
| 2021/0083227 A1* | 3/2021 | Her | H01L 27/3248 |
| 2021/0150941 A1* | 5/2021 | Bu | G02F 1/133305 |

* cited by examiner

OPTICAL FILM, DISPLAY SCREEN ASSEMBLY AND DISPLAY DEVICE

The application claims priority to the Chinese patent application No. 201910002335.X filed on Jan. 2, 2019, the entire disclosure of which is incorporated herein by reference as part of the present application.

TECHNICAL FIELD

Embodiments of the present disclosure relate to an optical film, a display screen assembly and a display device.

BACKGROUND

Organic light-emitting diode (OLED) display device is an electroluminescence device widely used in the fields of display technology and the like for its advantages of self-luminous property, high luminous efficiency, low working voltage, small weight and size, flexibility, and simple manufacturing process, etc.

Display screen assembly is one of key components in an OLED display device. FIG. 1 is a structural diagram of a display screen assembly in an OLED display device according to related art. As illustrated in FIG. 1, the display screen assembly includes a cover plate 01 and a display panel 02 which are arranged in lamination. A side surface of the cover plate 01 close to the display panel 02 is attached with a decorative film 03, and an edge portion of the decorative film 03 is a light blocking area which prevents light emitted by an edge area of the display panel 02 from exiting through an edge area of the cover plate 01.

However, in an actual assembling process of the display screen assembly, due to poor level of bonding process, a bonding misplacement may be easily occurred between the cover plate 01 and the decorative film 03. As illustrated in FIG. 1, the bonding misplacement results in that the light blocking area of the decorative film 03 cannot shield the edge area of the cover plate 01, which in turn results in that light emitted from a side area of the display panel 02 exits through the edge area of the cover plate 01 (also known as DECO light leakage). This significantly degrades a display effect of the display device.

SUMMARY

Embodiments of the present disclose provide an optical film, a display screen assembly and a display device, which can solve the problem in the related art that light leakage is easily occurred in the edge area of the cover plate of the display screen assembly.

In order to achieve the objective above, on the first aspect, an embodiment of the present disclosure provides an optical film including a light transmitting film and a light blocking film; the light transmitting film is a double-sided adhesive film; the light blocking film is a flexible film and is connected with a periphery of the light transmitting film.

In an optional embodiment, a plurality of light transmitting films is provided; the light blocking films are each connected with the periphery of the light transmitting film, and are uniformly distributed along the periphery of the light transmitting film.

In an optional embodiment, the light transmitting film is in a quadrangle shape and has four side edges; the number of the light blocking film is four, and each of the four light blocking films has a first side edge, and first side edges of the four light blocking films are connected with the four side edges of the light transmitting film in one-to-one correspondence.

In an optional embodiment, a length of the first side edge of each of the four light blocking films is as same as a length of the corresponding side edge of the light transmitting film.

In an optional embodiment, the light blocking film is provided with a moisture-oxygen barrier layer.

In an optional embodiment, the light blocking film includes a first light blocking sub-film and a second light blocking sub-film attached with each other, both of the first light blocking sub-film and the second light blocking sub-film are connected with the periphery of the light transmitting film, and at least part of the first light blocking sub-film is detachable from the second light blocking sub-film.

In an optional embodiment, the light blocking film is an adhesive film.

In an optional embodiment, the light transmitting film is an Optically Clear Adhesive (OCA) film.

On the second aspect, an embodiment of the present disclosure further provides a display screen assembly, including a cover plate, a display panel and the optical film described in the first aspect; the cover plate and the display panel are arranged in lamination, the light transmitting film is disposed between the cover plate and the display panel, and the light blocking film is connected with a side surface of the display panel facing away from the cover plate so as to encapsulate at least part of the side surface of the display panel.

In an optional embodiment, the display screen assembly further includes a touch panel, the touch panel and the display panel are arranged in lamination, the touch panel is located between the cover plate and the display panel, and the light transmitting film is disposed between the cover plate and the touch panel.

In an optional embodiment, the display screen assembly further includes a touch panel, the touch panel and the display panel are arranged in lamination, the touch panel is located between the cover plate and the display panel, and the light transmitting film is disposed between the display panel and the touch panel.

In an optional embodiment, a part of the light blocking film is located between the display panel and the touch panel.

In an optional embodiment, the light blocking film includes a first light blocking sub-film and a second light blocking sub-film attached with each other, both of the first light blocking sub-film and the second light blocking sub-film are connected with the periphery of the light transmitting film, and at least part of the first light blocking sub-film is detachable from the second light blocking sub-film; the first light blocking sub-film is connected with a side surface of the display panel facing away from the cover plate so as to encapsulate at least part of the side surface of the display panel; the second light blocking sub-film is connected with a side surface of the cover plate close to the touch panel so as to encapsulate at least part of a side surface of the touch panel.

On the third aspect, an embodiment of the present disclosure further provides a display device including the display screen assembly described in the second aspect.

BRIEF DESCRIPTION OF THE DRAWINGS

In order to clearly illustrate the technical solutions of the embodiments of the present disclosure, the drawings of the embodiments will be briefly described in the following.

Apparently, the described embodiments just relate to a part of the embodiments of the present disclosure without limiting the present disclosure thereto.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
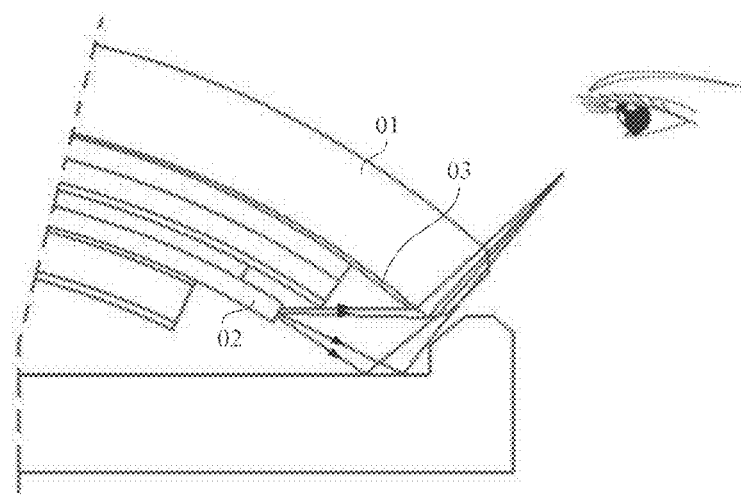
FIG. 1 is a structural diagram of an optical film according to related art.
Figure 2:
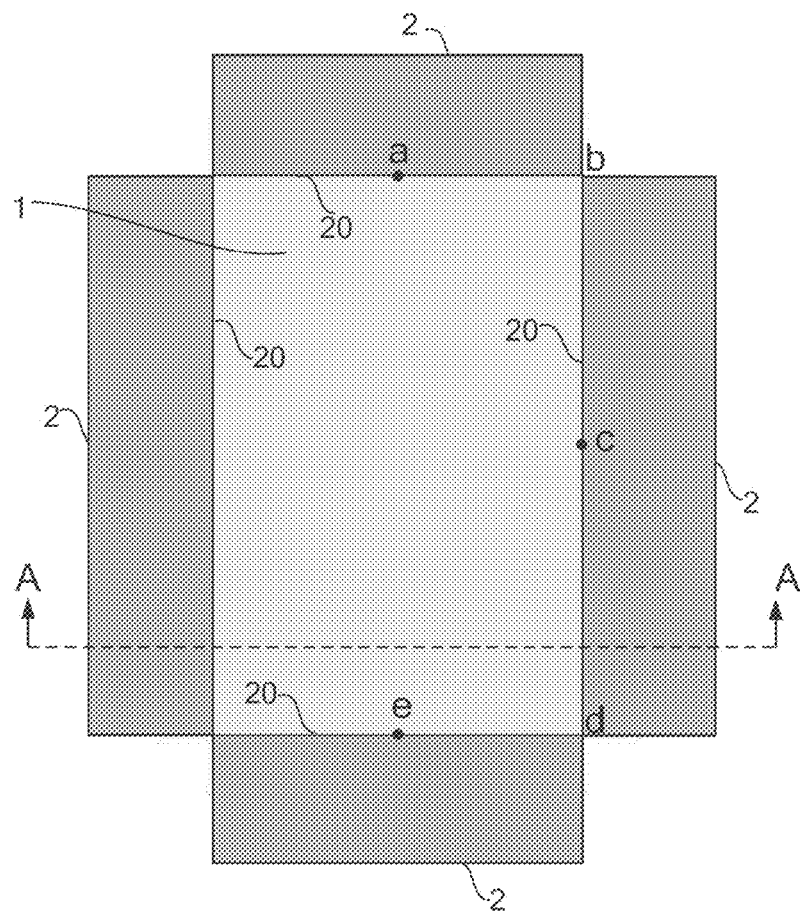
FIG. 2 is a plan view of an optical film provided by an embodiment of the present disclosure.
Figure 3:
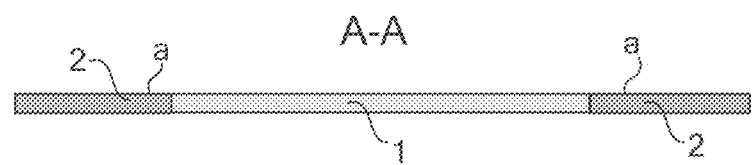
FIG. 3 is a sectional view of an optical film provided by an embodiment of the present disclosure along A-A direction.

On the first aspect, an embodiment of the present disclosure provides an optical film. As illustrated in FIG. 2 and FIG. 3, the optical film can include a light transmitting film 1 and a light blocking film 2; the light transmitting film 1 is a double-sided adhesive film, and the light blocking film 2 is a flexible film and is connected with a periphery of the light transmitting film 1.

Figure 5:
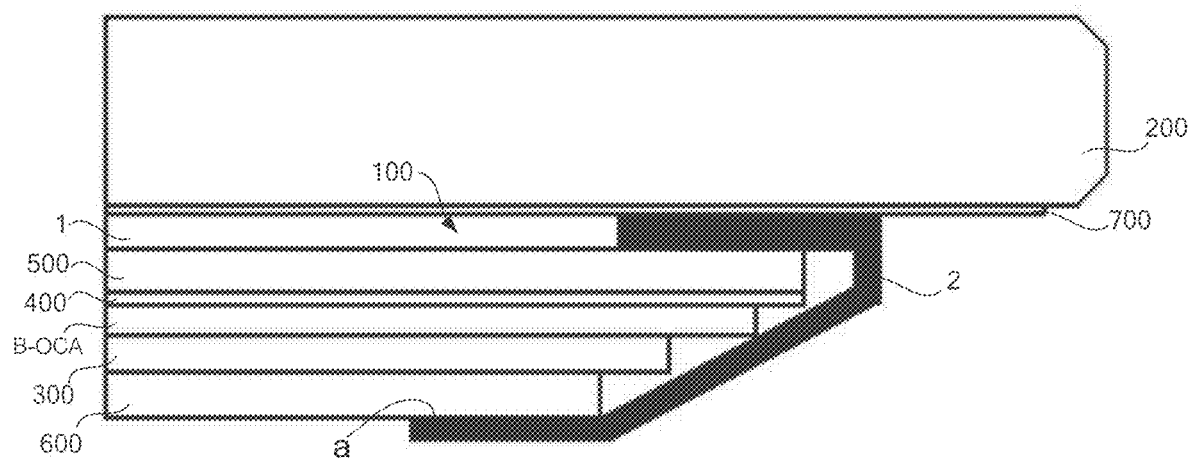
FIG. 5 is a structural diagram of a display screen assembly provided by an embodiment of the present disclosure.
Figure 6:
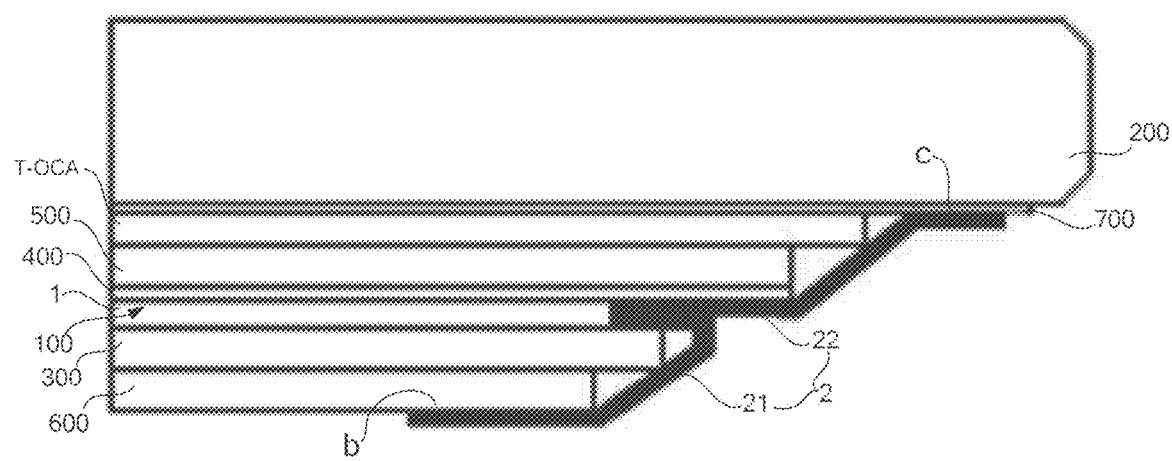
FIG. 6 is a structural diagram of a display screen assembly provided by another embodiment of the present disclosure.

According to the embodiment of the present disclosure, the light transmitting film 1 mainly serves for bonding two components with each other. For example, as illustrated in FIG. 5, the light transmitting film 1 is configured to bond a cover plate 200 with a polaroid 500. For another example, as illustrated in FIG. 6, the light transmitting film 1 is configured to bond a touch panel 400 with a display panel 300.

The optical film provided by the embodiment of the present disclosure includes a light transmitting film 1 and a light blocking film 2 which is a flexible film and is connected with a periphery of the light transmitting film 1. In this way, after a display screen assembly is assembled, the light blocking film 2 can be connected with a side surface of the display panel 300 facing away from the cover plate 200. For example, as illustrated in FIG. 5, the light blocking film 2 can be connected with a heatsink 600 so that the light blocking film 2 can encapsulate the side surface of the display panel 300 to prevent light emitted by the side surface of the display panel 300 corresponding to the light blocking film 2 from exiting through an edge area of the cover plate 200, thereby reducing an amount of light leakage at the edge area of the cover plate 200 and improving a display effect of the display device.

In the embodiment above, a plurality of light blocking films 2 can be provided. As illustrated in FIG. 2, the light blocking films 2 are each connected with the periphery of the light transmitting film 1, and are uniformly distributed along the periphery of the light transmitting film 1. In an alternative embodiment, only one light blocking film 2 can be provided. As compared with the case of only one light blocking film 2, the arrangement of a plurality of light blocking films 2 can cover more area of the side surface of the display panel 300 and prevents more amount of light from exiting through the edge area of the cover plate 200 after a display screen assembly is assembled, because each of the light blocking films 2 can be connected with a side surface of the display panel 300 facing away from the cover plate 200 to encapsulate the side surface of the display panel 300. In this way, the amount of light leakage at the edge area of the cover plate 200 is considerably reduced, and the display effect of the display device is improved.

It should be explained that, as used herein, "the light blocking films 2 are uniformly distributed along the periphery of the light transmitting film 1" refers to that, for example, the light blocking films 2 are arranged along the periphery of the light transmitting film 1 at equal intervals; for example, as illustrated in FIG. 2, the light transmitting film 1 is in a rectangular shape with four side edges, each of the side edges of the light transmitting film 1 is connected with one light blocking film 2, and along the periphery of the light transmitting film 1, a distance (ab+bc) between the light blocking film 2 located at upper side and the light blocking film 2 located at right side is as same as a distance (cd+de) between the light blocking film 2 located at right side and the light blocking film 2 located at lower side.

As illustrated in FIG. 2, the light transmitting film 1 can be in a shape of rectangle; the number of the light blocking films 4 can be four; each of the four light blocking films 2 includes a first side edge 20, and first side edges 20 of the four light blocking films 2 are connected with the four side edges of the light transmitting film 1 in one-to-one correspondence. In addition to rectangle, the light transmitting film 1 can also be in other quadrangle shapes such as rhombus and square. Each of the side edges of the light transmitting film 1 is connected with the first side edge 20 of one light blocking film 2. The shape of the light blocking film 2 is not particularly limited in the embodiment of the present disclosure; for example, the shape of the light blocking film 2 can be rectangle or trapezoid. In the case of trapezoid, a bottom side of the trapezoid serves as the first side edge 20.

A relationship between a length of the first side edge 20 of each of the light blocking films 2 and a length of the corresponding side edge of the light transmitting film 1 is not particularly limited in the embodiment of the present disclosure. For example, as illustrated in FIG. 2, the length of the first side edge 20 of each of the light blocking films 2 can be as same as the length of the corresponding side edge of the light transmitting film 1. In an alternative embodiment, the length of the first side edge 20 of each of the light blocking films 2 can also be smaller than the length of the corresponding side edge of the light transmitting film 1. As compared with the latter case, the former case allows each of the light blocking films 2 to completely encapsulate the corresponding side surface of the display panel 300. In this way, it can prevent the light emitted by the display panel 300 from exiting through the edge area of the cover plate 200, so as to avoid light leakage at the edge area of the cover plate 200, thereby achieving better display effect of the display device.

In order to reduce a corrosion of the display panel 300 due to external moisture and oxygen, the light blocking film 2 can also be provided with a moisture-oxygen barrier layer. In this way, as illustrated in FIG. 5, after the side surface of the display panel 300 is encapsulated by the light blocking film 2, the moisture-oxygen barrier layer can prevent external water, oxygen and the like from entering and corroding the interior of the display panel 300 from a lateral direction of the display panel 300, so as to avoid any influence to the display effect of the display panel 300 due to moisture and oxygen, which is beneficial for improving the display quality of the display panel 300.

In the embodiment above, the moisture-oxygen barrier layer can be formed by, for example, adopting a material resistant to moisture and oxygen as a material of the light blocking film 2. In this way, the light blocking film 2 per se can serve as the moisture-oxygen barrier layer.

The structure of the light blocking film 2 in the optical film is not particularly limited in the embodiment of the present disclosure. For example, as illustrated in FIG. 3, the light blocking film 2 can be an integral film structure. In such case, as illustrated in FIG. 5, the light transmitting film 1 connected to this light blocking film 2 can be disposed between the cover plate 200 and the polaroid 500; furthermore, by connecting the light blocking film 2 with the heatsink 600, a side surface of the polaroid 500, a side surface of the touch panel 400 and a side surface of the display panel 300 all can be encapsulated, so as to prevent the light emitted by the side surface of the display panel 300 corresponding to the light blocking film 2 from exiting through the edge area of the cover plate 200; at the same time, when the light blocking film 2 is provided with the moisture-oxygen barrier layer, the light blocking film 2 also serves to prevent moisture and oxygen from invading into the polaroid 500, the touch panel 400 and the display panel 300, thereby ensuring normal operations of the polaroid 500, the touch panel 400 and the display panel 300.

Figure 4:
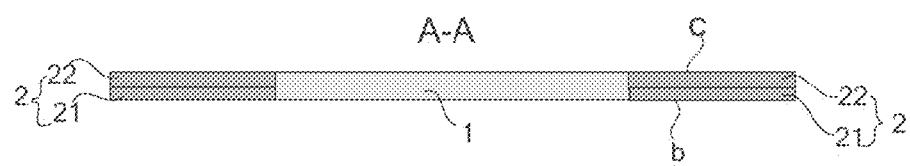
FIG. 4 is a sectional view of an optical film provided by another embodiment of the present disclosure along A-A direction.

In an alternative embodiment, as illustrated in FIG. 4, the light blocking film 2 can also include a first light blocking sub-film 21 and a second light blocking sub-film 22 attached with each other; both of the first light blocking sub-film 21 and the second light blocking sub-film 22 are connected with the periphery of the light transmitting film 1, and at least part of the first light blocking sub-film 21 is detachable from the second light blocking sub-film 22. In this way, as illustrated in FIG. 6, the light transmitting film 1 connected to the light blocking film 2 can be disposed between the touch panel 400 and the display panel 300; a part of the first light blocking sub-film 21 is separated from the second light blocking sub-film 22; the first light blocking sub-film 21 is connected with the heatsink 600 to completely encapsulate the side surface of the display panel 300; the second light blocking sub-film 22 is connected with a side surface of the cover plate 200 close to the touch panel 400 so as to encapsulate the side surface of the touch panel 400 and the side surface of the polaroid 500, thereby preventing the light emitted by the side surface of the display panel 300 corresponding to the light blocking film 2 from exiting through the edge area of the cover plate 200. Moreover, when each of the first light blocking sub-film 21 and the second light blocking sub-film 22 is provided with the moisture-oxygen barrier layer, the first light blocking sub-film 21 and the second light blocking sub-film 22 can also protect the polaroid 500, the touch panel 400 and the display panel 300 by preventing moisture and oxygen from invading into the polaroid 500, the touch panel 400 and the display panel 300, so as to ensure normal operations of the polaroid 500, the touch panel 400 and the display panel 300.

In the optical film provided by the embodiment of the present disclosure, the light blocking film 2 can be an adhesive film, and can also be a non-adhesive film. As compared with the latter case, the former case allows the light blocking film 2 to be directly bonded with other components/parts. For example, as illustrated in FIG. 5, the light blocking film 2 can be directly bonded with the heatsink 600, without the need of coating an adhesive layer onto the heatsink 600, which is considerably beneficial for the connection of the light blocking film 2 with other components/parts.

In the embodiment of the present disclosure, when the light blocking film 2 is an adhesive film, it can be a single-sided adhesive film, and can also be a double-sided adhesive film. As illustrated in FIG. 3 and FIG. 5, the light blocking film 2 is a single-sided adhesive film, with the side a as the adhesive side. As illustrated in FIG. 4 and FIG. 6, the light blocking film 2 is a double-sided adhesive film, in which the side b serves as an adhesive side of the first light blocking sub-film 21, namely the surface of the first light blocking sub-film 21 facing away from the second light blocking sub-film 22, and the side c serves as an adhesive side of the second light blocking sub-film 22, namely the surface of the second light blocking sub-film 22 facing away from the first light blocking sub-film 21.

The type of the light transmitting film 1 of the optical film is not particularly limited in the embodiment of the present disclosure. For example, the light transmitting film 1 can be an Optically Clear Adhesive (OCA) film. In other alternative embodiments, the light transmitting film 1 can also be a film of other types. When the light transmitting film 1 is an OCA film, it has advantages of high clarity level, high transmittance (greater than 99% for all light), high adhesive force, high weather-resistant property, high water-resistant property, high temperature resistance, UV-resistant property and the like, which are beneficial to improve the display quality of the display device.

On the second aspect, an embodiment of the present disclosure further provides a display screen assembly. As illustrated in FIG. 5, the display screen assembly can include a cover plate 200, a display panel 300 and the optical film 100 described in the first aspect. The cover plate 200 and the display panel 300 are arranged in lamination; the light transmitting film 1 is disposed between the cover plate 200 and the display panel 300; the light blocking film 2 is connected with a side surface of the display panel 300 facing away from the cover plate 200 so as to encapsulate the side surface (the complete side surface or a part of the side surface) of the display panel 300.

In the present embodiment, the display panel 300 can be an OLED display panel 300; the light blocking film 2 can be directly connected with the side surface of the display panel 300 facing away from the cover plate 200, and can also be connected with the side surface of the display panel 300 facing away from the cover plate 200 through an intermediate component. For example, as illustrated in FIG. 5, the light blocking film 2 is connected with the side surface of the display panel 300 facing away from the cover plate 200 through the heatsink 600.

The display screen assembly provided by the embodiment of the present disclosure includes the optical film described in any of the foregoing embodiments. As a result, the technical problem(s) to be solved and the technical effect(s) to be achieved by the display screen assembly of the embodiment of the present disclosure can be referred to that of the foregoing embodiment related to the optical film, which will not be repeated herein.

In optional embodiments, as illustrated in FIG. 5, the display screen assembly can further include a touch panel 400 (e.g., sensor); the touch panel 400 and the display panel 300 can be arranged in lamination; and the touch panel 400 can be located between the cover plate 200 and the display panel 300. In this way, the display screen assembly can realize a touch control function to be applied in terminal devices having touch and control requirements, such as mobile phone and tablet computer.

The location/position of the optical film 100 is not particularly limited in the embodiment of the present disclosure. For example, as illustrated in FIG. 5, the light transmitting film 1 of the optical film 100 can be disposed between the cover plate 200 and the touch panel 300; and the touch panel 400 can be bonded with the display panel 300 through another OCA film (e.g., B-OCA film). In this way, as illustrated in FIG. 5, the light blocking film 2 connected to the light blocking film 1 can be connected with a side surface of the display panel 300 facing away from the cover plate 200 so as to encapsulate both the side surface of the touch panel 400 and the side surface of the display panel 300, thereby preventing the light emitted by the side surface of the display panel 300 corresponding to the light blocking film 2 from exiting through the edge area of the cover plate 200; at the same time, when the light blocking film 2 is provided with a moisture-oxygen barrier layer, it can also prevent moisture and oxygen from invading into the touch panel 400 and the display panel 300, so as to ensure normal operations of the touch panel 400 and the display panel 300. For another example, as illustrated in FIG. 6, the light transmitting film 1 of the optical film 100 can also be disposed between the display panel 300 and the touch panel 400; and the cover plate 200 can be bonded with the touch panel 400 through yet another OCA film (e.g., a T-OCA film). Such arrangement can also achieve the effect of preventing the light emitted by the side surface of the display panel 300 corresponding to the light blocking film 2 from exiting through the edge area of the cover plate 200; at the same time, when the light blocking film 2 is provided with a moisture-oxygen barrier layer, it can also prevent moisture and oxygen from invading into the display panel 300.

According to the embodiment of the present disclosure, as illustrated in FIG. 6, the first light blocking sub-film 21 is connected with a side surface of the display panel 300 facing away from the cover plate 200 so as to encapsulate at least part of the side surface of the display panel 300; the second light blocking sub-film 22 is connected with a side surface of the cover plate 200 close to the touch panel 400 so as to encapsulate at least part of a side surface of the touch panel 400. In this way, it can prevent the light emitted by the side surface of the display panel 300 corresponding to the light blocking film 2 from exiting through the edge area of the cover plate 200; furthermore, when each of the first light blocking sub-film 21 and the second light blocking sub-film 22 is provided with a moisture-oxygen barrier layer, it can also protect the touch panel 400 and the display panel 300, prevent moisture and oxygen from invading into the touch panel 400 and the display panel 300, so as to ensure normal operations of the polaroid 500, the touch panel 400 and the display panel 300.

Figure 7:
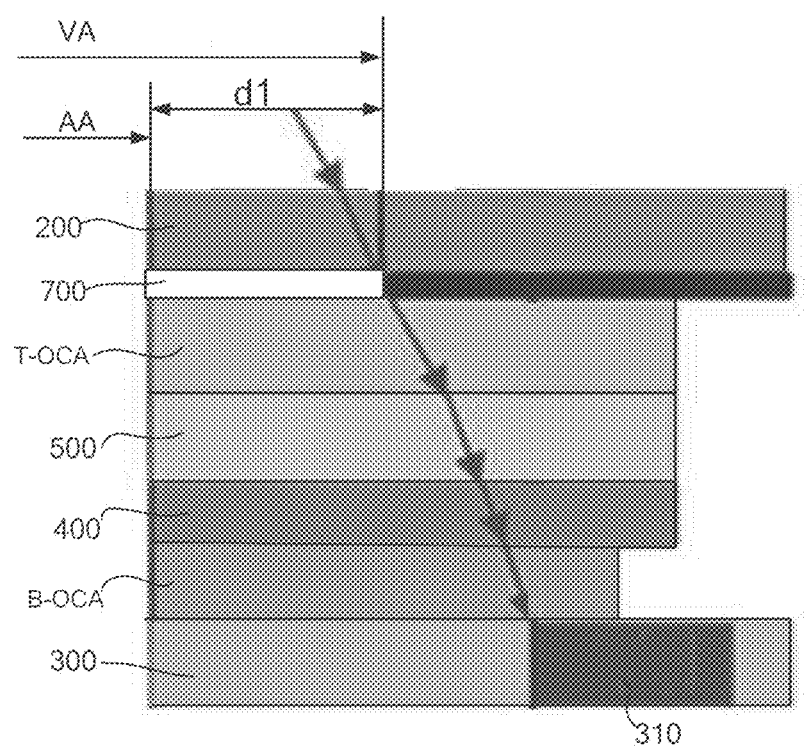
FIG. 7 is a schematic diagram illustrating BP light leakage in an existing display screen assembly.

As illustrated in FIG. 7, an area 310 with intensively arranged metal wrings is provided outside a display area (active area, short for AA) of the display panel 300. The area 310 with intensively arranged metal wrings has excellent reflective property, and if a view area (VA) of the cover plate 200 has a larger size, that is, if a distance d1 between a border of AA of the display panel 300 and a border of VA of the cover plate 200 is relatively longer, the area 310 with intensively arranged metal wrings may be observable from a surface of the cover plate 200 at a wider viewing angle, which is also referred to as BP light leakage and affects a visual experience of users. In order to solve the problem that the area 310 with intensively arranged metal wrings may be observable from a surface of the cover plate 200 at a wider viewing angle, it has to narrow the VA of the cover plate 200, that is, to decrease a value of d1. Because the VA of the cover plate 200 is formed by a decorative film 700 bonded with the cover plate 200 (a central portion of the decorative film 700 is a light transmitting area, and a periphery of the decorative film 700 is a light blocking area), decreasing the value of d1 requires for higher accuracy of a bonding process of the decorative film 700. Any error involved in the bonding process of the decorative film 700 may result in difficulty of reducing the value of d1, which in turn increases the cost for bonding the decorative film 700 with the cover plate 200.

Figure 8:
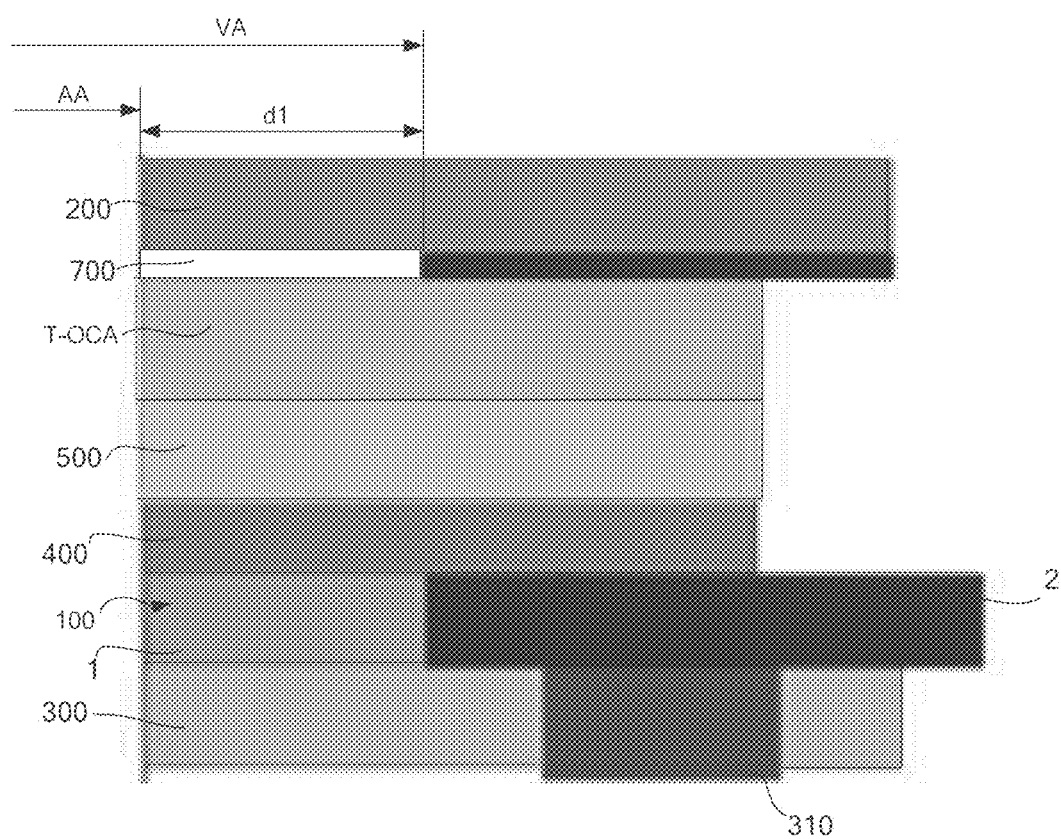
FIG. 8 is a principle diagram illustrating how to solve BP light leakage according to an embodiment of the present disclosure.

In order to solve the problem above, in the embodiment of the present disclosure, as illustrated in FIG. 8, a part of the light blocking film 2 is located between the display panel 300 and the touch panel 400. In this way, as illustrated in FIG. 8, the part of the light blocking film 2 located between the display panel 300 and the touch panel 400 can block the area 310 with intensively arranged metal wirings in the display panel 300, so that this area 310 cannot be observed from the surface of the cover 200 at wider viewing angle, thereby improving the visual experience of the users. As the light blocking film 2 is utilized to block the area 310 with intensively arranged metal wirings so as to solve the problem of BP light leakage, it has no need of decreasing the value of d1, and the VA can maintain its original size or can be made larger, which considerably lowers the accuracy requirement on the bonding process of the decorative film 700 and is beneficial to reduce the cost for bonding the decorative film 700 with the cover plate 200.

In the embodiment where the light blocking film 2 includes a first light blocking sub-film 21 and a second light blocking sub-film 22, the part of the light blocking film 2 located between the display panel 300 and the touch panel 400 can be a part of the first light blocking sub-film 21, can be a part of the second light blocking sub-film 22, and can also include both parts of the first light blocking sub-film 21 and the second light blocking sub-film 22 (as illustrated in FIG. 6), which is not particularly limited in the embodiment of the present disclosure.

In an embodiment where the display panel 300 is an OLED display panel 300, ambient light that is incident onto a cathode (usually is made of metal material) of the display panel 300 may be reflected back to affect the contrast ratio. In order to solve such problem, in an embodiment of the present disclosure, as illustrated in FIG. 5, a polaroid 500 is further disposed between the touch panel 400 and the cover plate 200 so that when the ambient light passes through the polaroid 500, the user's eyes cannot observe the light reflected back from the cathode of the display panel 300, thereby considerably improving the contrast ratio.

On the third aspect, an embodiment of the present disclosure further provides a display device including the display screen assembly described in the second aspect.

The display device provided by the embodiment of the present disclosure can be any device or component with display function, such as mobile phone, tablet computer, television and computer displayer.

The display device provided by the embodiment of the present disclosure includes the display screen assembly described in any of the foregoing embodiments. As a result, the technical problem(s) to be solved and the technical effect(s) to be achieved by the display device provided by the embodiment of the present disclosure can be referred to that of the foregoing embodiment related to the optical film, which will not be repeated herein.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

The above are only specific implementations of the present disclosure, and the protection scope of the present disclosure is not limited thereto. Any modifications or substitutions easily occur to those skilled in the art within the technical scope of the present disclosure should be fallen within the protection scope of the present disclosure. Therefore, the protection scope of the present disclosure should be based on the protection scope of the claims and the equivalents thereof.

What is claimed is:

1. An optical film, comprising: a light transmitting film and a light blocking film, wherein
the light transmitting film is a double-sided adhesive film; and
the light blocking film is a flexible film and is connected with a periphery of the light transmitting film,
wherein the light blocking film comprises a first light blocking sub-film and a second light blocking sub-film attached with each other,
both of the first light blocking sub-film and the second light blocking sub-film are connected with the periphery of the light transmitting film, and
at least part of the first light blocking sub-film is detachable from the second light blocking sub-film, so that the at least part of the first light blocking sub-film is separated from the second light blocking sub-film while at least another part of the first light blocking sub-film being in contact with the second light blocking sub-film.

2. The optical film according to claim 1, wherein a plurality of light blocking films is provided,
the light blocking films are each connected with the periphery of the light transmitting film, and are uniformly distributed along the periphery of the light transmitting film.

3. The optical film according to claim 2, wherein the light transmitting film is in a quadrangle shape and has four side edges,
the number of the light blocking films is four, each of the four light blocking films has a first side edge, and first side edges of the four light blocking films are connected with the four side edges of the light transmitting film in one-to-one correspondence.

4. The optical film according to claim 3, wherein a length of the first side edge of each of the four light blocking films is as same as a length of the corresponding side edge of the light transmitting film.

5. The optical film according to claim 1, wherein the light blocking film is provided with a moisture-oxygen barrier layer.

6. The optical film according to claim 1, wherein the light blocking film is an adhesive film.

7. The optical film according to claim 1, wherein the light transmitting film is an Optically Clear Adhesive (OCA) film.

8. A display screen assembly, comprising a cover plate, a display panel and the optical film according to claim 1,
the cover plate and the display panel are arranged in lamination, the light transmitting film is disposed between the cover plate and the display panel, and the light blocking film is connected with a side surface of the display panel facing away from the cover plate so as to encapsulate at least part of the side surface of the display panel.

9. The display screen assembly according to claim 8, further comprising a touch panel,
the touch panel and the display panel are arranged in lamination,
the touch panel is located between the cover plate and the display panel, and
the light transmitting film is disposed between the cover plate and the touch panel.

10. The display screen assembly according to claim 8, further comprising a touch panel,
the touch panel and the display panel are arranged in lamination,
the touch panel is located between the cover plate and the display panel, and
the light transmitting film is disposed between the display panel and the touch panel.

11. The display screen assembly according to claim 10, wherein a part of the light blocking film is located between the display panel and the touch panel.

12. The display screen assembly according to claim 10, wherein
the first light blocking sub-film is connected with a side surface of the display panel facing away from the cover plate so as to encapsulate at least part of the side surface of the display panel; the second light blocking sub-film is connected with a side surface of the cover plate close to the touch panel so as to encapsulate at least part of a side surface of the touch panel.

13. A display device, comprising the display screen assembly according to claim 8.

14. The display screen assembly according to claim 8, wherein a plurality of light blocking films is provided,
the light blocking films are each connected with the periphery of the light transmitting film, and are uniformly distributed along the periphery of the light transmitting film.

15. The display screen assembly according to claim 14, wherein the light transmitting film is in a quadrangle shape and has four side edges,
the number of the light blocking films is four, each of the four light blocking films has a first side edge, and first side edges of the four light blocking films are connected with the four side edges of the light transmitting film in one-to-one correspondence.

16. The display screen assembly according to claim 15, wherein a length of the first side edge of each of the four light blocking films is as same as a length of the corresponding side edge of the light transmitting film.

17. The display screen assembly according to claim 8, wherein the light blocking film is provided with a moisture-oxygen barrier layer.

18. The display screen assembly according to claim 8, wherein the light blocking film is an adhesive film.

19. The display screen assembly according to claim 8, wherein the light transmitting film is an Optically Clear Adhesive (OCA) film.

* * * * *